July 5, 1966 I. K. DORTORT 3,259,831

BALANCING CIRCUIT FOR ELECTRICALLY INTERCONNECTED SEMICONDUCTOR DEVICES

Original Filed Dec. 2, 1960 3 Sheets-Sheet 1

INVENTOR.
ISADORE K. DORTORT

BY

OSTROLENK, FABER, GERB & SOFFEN

ATTORNEYS

INVENTOR.
ISADORE K. DORTORT

BY

OSTROLENK, FABER, GERB & SOFFEN

ATTORNEYS

INVENTOR.
ISADORE K. DORTORT

BY

OSTROLENK, FABER, GERB & SOFFEN
ATTORNEYS 3,259,831
Patented July 5, 1966

3,259,831

BALANCING CIRCUIT FOR ELECTRICALLY INTERCONNECTED SEMICONDUCTOR DEVICES

Isadore K. Dortort, Philadelphia, Pa., assignor to I-T-E Circuit Breaker Company, Philadelphia, Pa., a corporation of Pennsylvania Original application Dec. 2, 1960, Ser. No. 73,332. Divided and this application Feb. 13, 1964, Ser. No. 344,738
8 Claims. (Cl. 321—16)

This invention relates to balancing circuit for semiconductor devices, and is a division of my copending application Serial No. 73,332, now abandoned, filed December 2, 1960 and assigned to the assignee of the present invention. The invention more specifically relates to a novel combination of current balancing structure and controlled rectifier-type devices used in rectifiers or inverters or similar type equipment.

Current balancing circuits are well known to the art and are shown, for example, in my U.S. Patent No. 2,994,082, dated July 25, 1961, entitled "Current Balancing Reactors for Rectifier Elements" and assigned to the assignee of the present invention.

Where four-layer diodes or controlled rectifiers are used, once forward conduction is estiblished, it is necessary in many applications that the same forward current will flow through parallel connected elements so that one element will not carry an unnecessarily large proportion of the current of the parallel circuit. Thus, current balancing reactors may interconnect the various parallel connected elements in the manner of the above noted application. Where controlled rectifier elements are used, it is highly advantageous to take the gating circuit of various parallel connected elements through their respective current balancing reactors. Thus, if any of the parallel connected cells fails to pick up during the firing pulse supplied thereto to cause it to conduct, the use of the current balancing reactors in the circuit will assure additional power in the gating pulse so that it will positively conduct at the proper time.

Accordingly, a primary object of this invention is to provide novel balancing means for balancing the current between parallel connected semiconductor devices which are characterized in blocking current conduction in two directions.

A further object of this invention is to provide current balancing reactors for coupling parallel connected semiconductor devices to one another which are characterized in having two blocking directions wherein the current balancing reactors are further provided in the gating circuit of devices of the controlled rectifier type.

These and other objects of the invention will become apparent from the following description when taken in conjunction with the drawings, in which.

Figure 1:
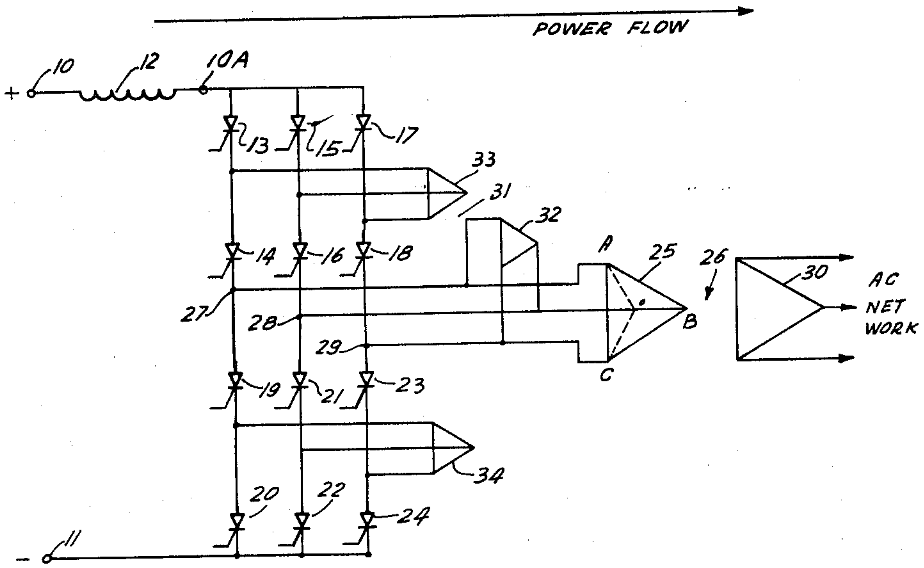
FIGURE 1 illustrates the novel combination of the invention of a semiconductor device having two blocking directions and a voltage balancing circuit for the case of an inverter circuit, frequency changing circuit or commutatorless motor.

Referring now to FIGURE 1, I have shown an inverter which is energized from a D.-C. system having a positive terminal 10 and negative terminal 11. The system is comprised of a three-phase bridge-connected rectifier system where the power flow has been reversed by reversing the polarity of the D.-C. terminals in the usual manner.

Figure 2:
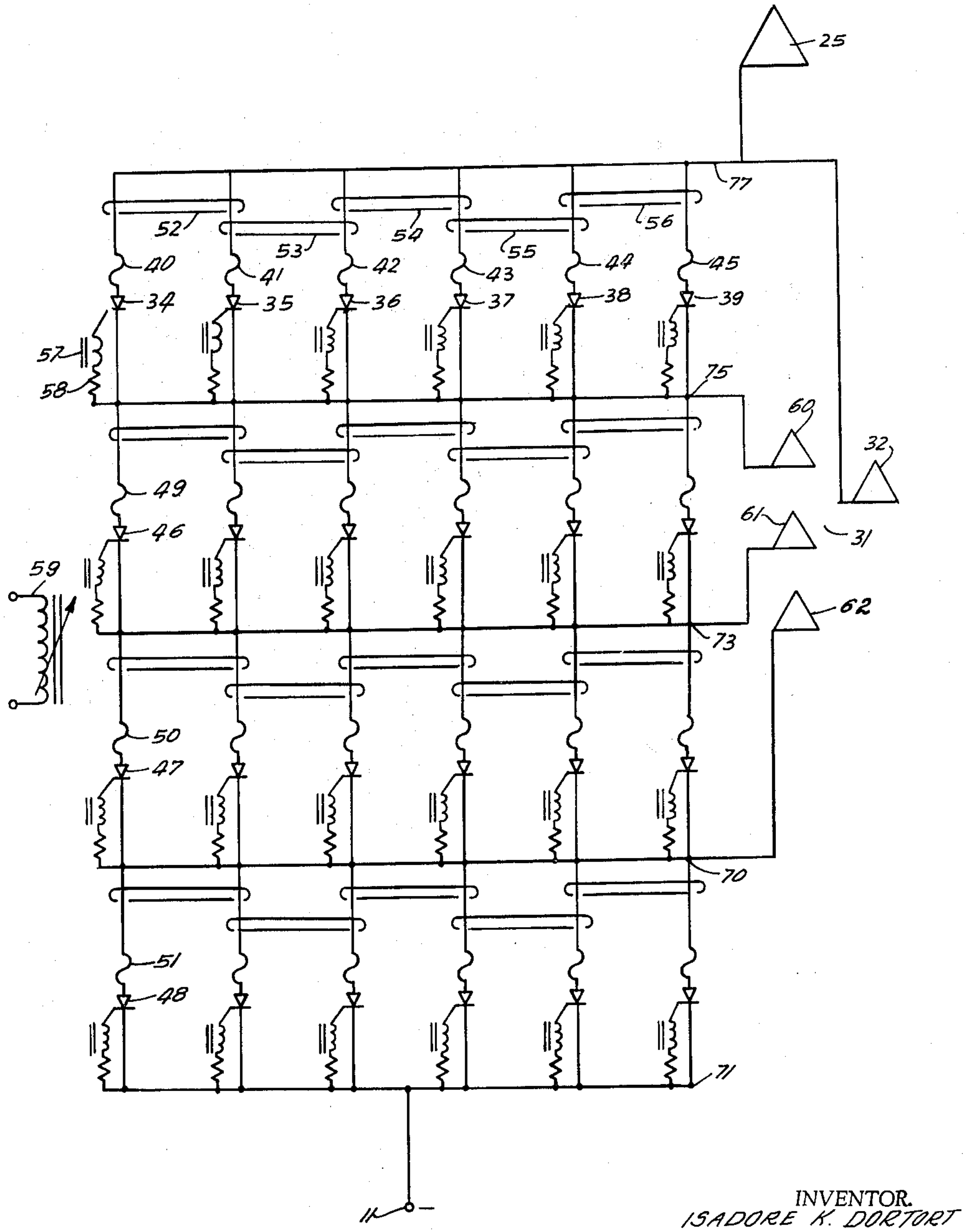
FIGURE 2 shows the specific construction of each of the arms of the inverter circuit of FIGURE 1, and specifically illustrates the plurality of series and parallel connected semiconductor elements of the controlled rectifier type.

Terminal 10 of the system is connected through a smoothing choke 12 to the three negative arms of the bridge. The first bridge arm is shown as having two series connected semiconductor devices 13 and 14 where these are shown each as having gating electrodes. As will be shown more fully hereinafter, each of devices 13 and 14 schematically represent a large plurality of controlled rectifiers, as shown in FIGURE 2.

The second bridge arm includes two series connected groups of systems 15 and 16, while the third and negative bridge arm has groups of elements 17 and 18.

The negative terminal 11 is connected to the positive bridge arms which include semiconductor devices 19–20, 21–22 and 23–24 respectively. The primary winding 25 of a power transformer 26 then has connections made to points 27, 28 and 29 which correspond to phases A, B and C of a multiphase system, and the secondary winding 30 of the transformer is then connected from a A.-C. network or A.-C. system, as shown.

In accordance with the present invention, and assuming, for example, that elements 13 through 24 are controlled rectifiers such as the well-known silicon controlled rectifier, or, in the alternative, are four-layer diodes, it is necessary that both the reverse voltage across the two series connected elements be balanced between the two so that one does not carry more than its share of reverse voltage which could lead to a possible break-down of the unit. At the same time, however, and since the devices shown are characterized in having two blocking directions, it is also necessary that voltage balancing in the forward direction also be achieved.

In accordance with the present invention, auxiliary transformer 31 having primary winding 32, and secondary windings 33 and 34 are connected between the junction of the series connected elements so that each of the series connected elements will have its own respective auxiliary source of A.-C. voltage which will predetermine the reverse voltage across the elements, in accordance with the teachings of my U.S. Patent 2,895,099.

In the present invention, however, not only will the reverse voltage be balanced between the elements such as elements 13 and 14, but, in addition, the forward voltage will also be balanced until the elements begin to conduct in their forward direction.

The bridge arm including elements 19 and 20 has been shown in FIGURE 2 in its complete form where the number of series connected elements has been increased to four rather than the two shown in FIGURE 1. In all other respects like components of FIGURE 1 are given similar identifying numerals in FIGURE 2.

Referring now to FIGURE 2, I have shown the bridge arm as being formed of four banks of six parallel connected controlled rectifiers. Thus, the first bank of controlled rectifiers includes elements 34 through 39. Each of elements 34 through 39 are provided with respective series connected fuses 40 through 45 in the manner shown in U.S. Patent 2,932,781 to Otto Jensen, entitled "Semiconductor Protective Means" and assigned to the assignee of the present invention.

The lower three banks of FIGURE 2 which include controlled rectifiers 46, 47 and 48 respectively which have fuses 49, 50 and 51 respectively associated therewith are constructed in the same manner as described above for the upper bank.

Current balancing reactors schematically shown for the upper bank as reactors 52, 53, 54, 55 and 56 are similarly provided for each of the banks in the manner set forth in my U.S. Patent 2,994,082 for achieving balance between the various parallel connected elements when they conduct in their forward direction.

The gate electrode of each of the controlled rectifiers of FIGURE 2 is then provided with a circuit shown, for example, for controlled rectifier 34 which includes a transformer secondary winding 57 and a current limiting resistor 58. Each of secondary windings such as secondary winding 57 is coupled to a main primary winding 59 shown schematically in FIGURE 2 as being of adjustable phase. Clearly, a similar secondary winding will be provided for each of the other arms of the bridge where the phase relationship between their voltages are such as to give the desired firing characteristics to the various arms. To achieve voltage control, it is clear that the phase of the transformer such as winding 59 is altered so that secondary winding such as secondary winding 57 is appropriately energized earlier or later to cause conduction of the controlled rectifiers at an earlier or later time.

In accordance with the invention, the four series connected banks have the voltages thereacross balanced as by providing the voltage balancing transformer 31 with three secondary windings 60, 61 and 62 connected as shown in FIGURE 2 for the case of the arm of FIGURE 1 which includes elements 19 and 20. Each of the other arms of the rectifier will, of course, be constructed in the same manner as that shown for FIGURE 2 with the junction between series connected rectifiers connected as shown for secondary windings 60, 61 and 62 with appropriate modification for the different phasing of the particular arm.

Figure 3:
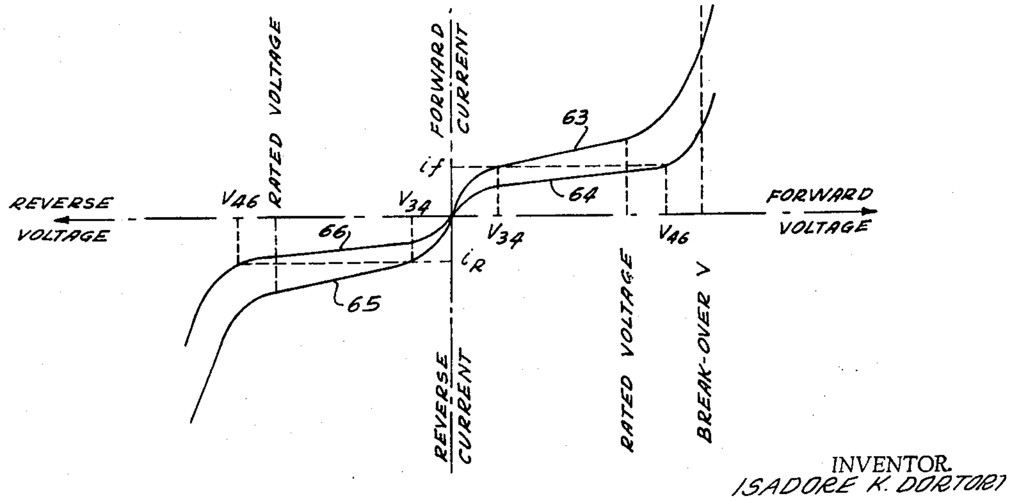
FIGURE 3 illustrates the voltage-current characteristics of two controlled rectifiers of the type which can be used in FIGURE 2.

The necessity for voltage balancing between the various diodes of the various banks of FIGURE 2 is clear from a consideration of FIGURE 3 which shows, for example, the characteristics of controlled rectifiers 34 and 46. The forward leakage current characteristics of controlled rectifier 34 is shown in curve 63, while the forward leakage current characteristics of controlled rectifier 46 is shown in curve 64. The reverse current characteristics of diode 34 is shown in curve 65, while the reverse current characteristics of controlled rectifier 46 is shown in curve 66. These curves are plotted in the usual manner for forward voltage, forward current, reverse voltage and reverse current.

As seen in FIGURE 3, under reverse voltage conditions, only a single current $i_r$ which is the reverse current of the series connected rectifiers can flow. Accordingly, the reverse voltage across diode 34 will be $V_{34}$, while the reverse voltage across diode 46 will be $V_{46}$. If these two diodes are to properly operate and are properly designed, they will both have to withstand the same predetermined voltage, this being shown in FIGURE 3 as the dotted line labeled "rated voltage." Clearly, however, the voltage across diode 46 exceeds this value and the diode will, in all probability, fail.

In order to insure that the voltage across elements 34 and 46 in their reverse direction are adequately balanced, the transformer windings 60 and 61 directly apply a respective reverse voltage across these elements. Furthermore, they provide a source of reverse current for the respective elements so that the reverse current need not be drawn through their series connections. This assures appropriate voltage balancing.

It will be noted that the next secondary winding 62 operates in the balancing of voltage between elements 47 and 48. The manner in which this voltage balancing proceeds has been fully described in the above noted U.S. Patent 2,895,099, and reference is made thereto for a complete description of this operation.

The essence of the present invention recognizes that such voltage balancing may be used in combination with controlled rectifiers, or more generally, with elements characterized by blocking in both directions. This is shown in FIGURE 2 where a controlled rectifier is combined with the control circuit.

A study of FIGURE 3 will indicate that all of the problems which arise in connection with distribution of reverse voltage in rectifiers will similarly arise in the forward blocking direction of elements which also block for at least a portion of the forward cycle.

Thus, in FIGURE 3 and until an appropriate gate current is applied, or until the forward voltage reaches a sufficient value with respect to the applied gate current, substantially the only current conduction that occurs will be current conduction by minority carriers, so that the operation of the device during blocking conditions in the forward direction is similar to operation in the reverse direction described above. Where the forward leakage current characteristics are not matched as shown in FIGURE 3, it is again seen that the forward voltage $V_{46}$ which appears across diode 46 of FIGURE 2 will be substantially higher than the voltage $V_{34}$ across the element 34, since the same forward current $i_f$ must flow through these two elements. Since $V_{46}$ can exceed the rated voltage as shown in FIGURE 3 for the forward conducting characteristic, the controlled rectifier can be caused to conduct at an earlier time than the remaining rectifiers so that control of these elements is lost.

It will be noted that this forward balancing system is applicable not only in the illustrated inverter circuit, but is applicable generally wherever series connected controlled rectifiers are used. Similar remarks would be applicable to other types of devices having a forward blocking voltage, such as the four-layer diode.

Figure 4:
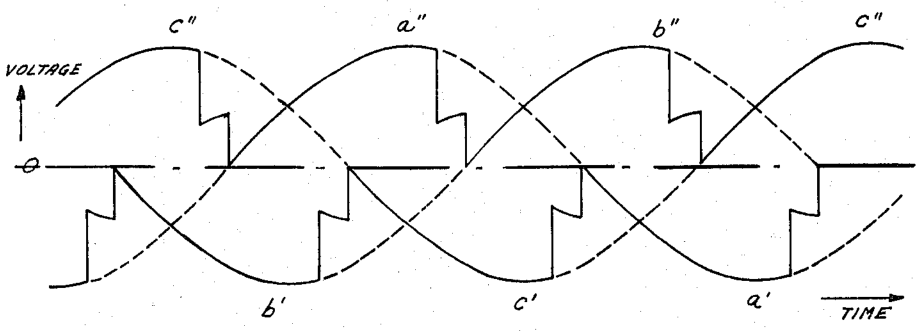
FIGURE 4 shows the voltage relationship of the D.-C. terminals of the inverter of FIGURE 1 with respect to the neutral zero of the transformer.

In the operation of the circuit of FIGURE 2 as an inverter, FIGURE 4 illustrates in solid lines the voltage relationship of terminals 10$^A$ and 11 with respect to the neutral zero of transformer winding 25 schematically illustrated in FIGURE 1.

In FIGURE 4, the voltage *a'* is the voltage across elements 19–20, *b'* is the voltage across elements 21–22, *c'* is the voltage of elements 23 and 24. The voltage *a''* is the voltage of elements 13–14, the voltage *b''* is the voltage of elements 15–16, while the voltage *c''* is the voltage of elements 17 and 18.

The A.-C. component of the voltage developed by the system will appear across D.-C. choke 12. The dotted lines, together with the section of the solid line, show the phase voltages to neutral of the rectifier transformer.

Figure 5:
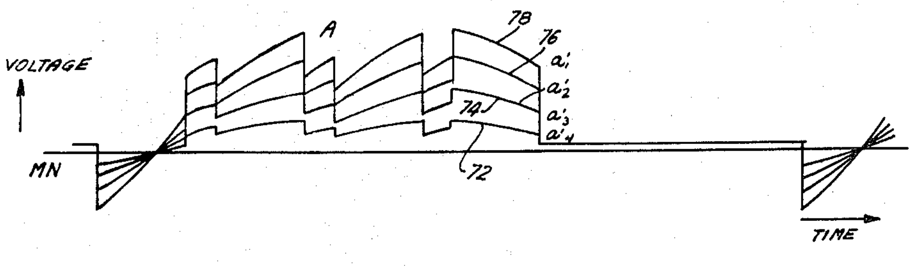
FIGURE 5 shows the inverse and forward blocking voltages of four of the series connected cells of FIGURE 2.

The inverse and forward blocking voltages that appear across the banks of FIGURE 2 are shown in FIGURE 5 which is plotted to the same time scale as in FIGURE 4. As shown in FIGURE 5, the voltage between bus 70 and 71 is illustrated by curve 72. The voltage between bus 75 and 71 is shown in curve 76, while the full voltage between bus 77 and bus 71 is shown in curve 78.

It will be seen from FIGURE 5 that there is an equal division of the full voltage between the various series connected elements of the system.

In FIGURE 2, I have shown each of the gate circuits of the controlled rectifier as having its own individual pulse winding 57. It will be understood by those skilled in the art that a simultaneous pulse can be applied to the gate circuits of all of the banks of the rectifier of a given arm by any desired means. By way of example, a single secondary winding having circuit connections to all parallel gates may be used. It is only necessary that all of the gates be operated simultaneously. This possibility of simultaneous operation of the gates is made possible in accordance with the invention by the voltage balancing circuit which assures that the forward voltage across the unit will be the same for all of the units.

Figure 6:
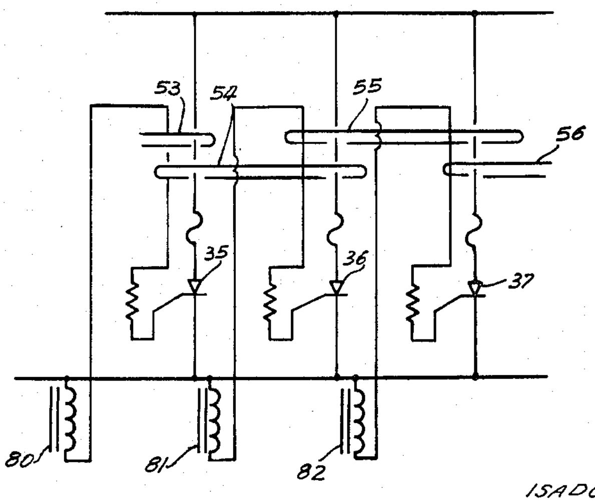
FIGURE 6 shows a modification of the circuit of FIGURE 2 wherein the gating circuit of the controlled rectifier is taken through the current balancing reactors.

In order to assure an additional gating pulse in the proper direction for any cell which may have failed to pick up current simultaneously with the others, it is possible, as shown in FIGURE 6 for the case of controlled rectifiers 35, 36 and 37 in FIGURE 2 as examples to take the series connection of the pulse transformer secondary windings 80, 81 and 82 to the gate of controlled rectifiers 35, 36 and 37 through the current balancing reactors of their respective conductors. By way of example, the conductor for pulse transformer secondary winding 80 may be connected to the gate of controlled rectifier 35 in a circuit which includes balancing reactors 53 and 54. With such a connection, if controlled rectifier 35 does not properly pick up along with controlled rectifier 36 and 37, for example, a sharp pulse will be induced in its gate circuit as, for example, from reactor 54 which will be in a proper direction to cause initiation of conduction of controlled rectifier 35.

Although I have described preferred embodiments of my novel invention, many variations and modifications will now be obvious to those skilled in the art, and I prefer, therefore, to be limited not by the specific disclosure herein but only by the appended claims.

The embodiments of the invention in which an exclusive privilege or property is claimed are defined as follows:

1. A current balancing circuit for first and second parallel connected controlled rectifiers; said first and second controlled rectifiers each having first and second main terminals and a control terminal; said current balancing circuit including a magnetic core having a first, second, third and fourth winding; one end of said first and second windings being connected in series with said first and second main terminals respectively of said first and second controlled rectifiers respectively; one end of said third and fourth windings being connected to said control terminal of said first and second controlled rectifiers respectively; the other end of said first and second windings being connected together; and a firing signal generating means; the other end of each of said third and fourth windings being connected to said firing signal generating means.

2. In a conversion circuit for exchanging energy between an A.-C. circuit and a D.-C. circuit; a current balancing circuit for first and second parallel connected controlled rectifiers; said first and second controlled rectifiers each having first and second main terminals and a control terminal; said current balancing circuit including a magnetic core having a first, second, third and fourth winding; one end of said first and second windings being connected in series with said first and second main terminals respectively of said first and second controlled rectifiers respectively; one end of said third and fourth windings being connected to said control terminal of said first and second controlled rectifiers respectively; the other end of said first and second windings being connected together; and a firing signal generating means; the other end of each of said third and fourth windings being connected to said firing signal generating means; one of said A.-C. circuit or said D.-C. circuit being connected to said other end of said first and second windings; the other of said A.-C. circuit or said D.-C. circuit being connected to said second main terminals of said first and second controlled rectifiers.

3. In combination for a current balancing circuit; a first, second and third controlled rectifier, a first and second magnetic core and a firing signal generating means; each of said first, second and third controlled rectifiers having first and second main terminals and a control terminal; each of said first and second magnetic cores having first, second, third and fourth windings; said first winding of said first magnetic core being connected in series with said first and second main terminals of said first controlled rectifier; said first winding of said second magnetic core and said second windings of said first magnetic core being connected in series with one another and in series with said first and second main terminals of said second controlled rectifier; said second windings of said second magnetic core being connected in series with said first and second terminals of said third controlled rectifier; said third winding of said first magnetic core having one end thereof connected to said control terminal of said first controlled rectifier and having its other end connected to said firing signal generating means; said third winding of said second magnetic core and said fourth winding of said first magnetic core being connected in series with one another and connected at one end to said control terminal of said second controlled rectifier and connected at their other end to said firing signal generating means; said fourth winding of said second magnetic core being connected at one end to said control terminal of said third controlled rectifier and at its other end to said firing signal generating means.

4. The device substantially as set forth in claim 3 wherein one end of said first winding of said first magnetic core and one end of each of said first and second windings of said second magnetic core are connected together; one of said first or second main terminals of said first, second and third controlled rectifiers being connected together.

5. The device substantially as set forth in claim 3 wherein said firing signal generating means includes a pulse generator.

6. The device substantially as set forth in claim 3 wherein said first and second windings of each of said first and second magnetic cores are wound in opposite directions.

7. The device substantially as set forth in claim 3 wherein said third and fourth windings of each of said first and second magnetic cores are wound in opposite directions.

8. The device substantially as set forth in claim 6 wherein said third and fourth windings of each of said first and second magnetic cores are wound in opposite directions.

References Cited by the Examiner

UNITED STATES PATENTS

| | | | |
|---|---|---|---|
| 2,895,099 | 7/1959 | Dortort | 321—11 |
| 2,932,781 | 4/1960 | Jensen | 321—27 |
| 2,986,692 | 5/1961 | Fischer | 321—27 |

LLOYD McCOLLUM, *Primary Examiner*

RALPH D. BLAKESLEE, *Examiner.*

G. GOLDBERG, *Assistant Examiner.*